United States Patent [19]

Massa

[11] 3,943,388

[45] Mar. 9, 1976

[54] ELECTROACOUSTIC TRANSDUCER OF THE FLEXURAL VIBRATING DIAPHRAGM TYPE

[75] Inventor: Frank Massa, Cohasset, Mass.

[73] Assignees: Fred M. Dellorfano, Jr.; Donald P. Massa, both of Cohasset, Mass.

[22] Filed: June 27, 1974

[21] Appl. No.: 483,549

[52] U.S. Cl........... 310/8.2; 179/110 A; 179/115 R; 179/138 R; 310/8.5; 310/9.1

[51] Int. Cl.[2]........................................ H01L 41/04

[58] Field of Search ............... 310/8.2, 8.5, 8.6, 8.7, 310/9.1, 9.4; 340/10, 14; 179/110 A, 115.5 ES, 115 R, 138 R, 121 D, 181; 181/173

[56] References Cited

UNITED STATES PATENTS

| | | | |
|---|---|---|---|
| 1,355,600 | 10/1920 | Gans | 179/138 R |
| 1,738,322 | 12/1929 | Schlenker | 181/173 |
| 1,815,945 | 7/1931 | Hopkins | 179/115 R |
| 2,910,545 | 10/1959 | Glenn | 179/110 A |
| 3,206,558 | 9/1965 | Shoot | 310/8.5 |
| 3,736,632 | 6/1973 | Barrow | 310/8.2 X |
| 3,876,890 | 4/1975 | Brown | 310/8.2 |

*Primary Examiner*—Mark O. Budd

[57] ABSTRACT

The invention describes a low cost transducer construction utilizing a vibratile diaphragm to form a closure for a cylindrical tubular housing. The sound radiating surface of the diaphragm is of a concave shape to achieve an increased diaphragm thickness at its periphery. The concave diaphragm design permits the precise adjustment of the resonant frequency of large quantities of mass produced transducers by machining the surface of the thick rim portion of the diaphragm. Greater precision in the adjustment of the resonant frequency is achieved with this design because the frequency change is less critically dependent on the amount of material removed than is the case with a conventional flat diaphragm surface as used in prior art designs.

9 Claims, 2 Drawing Figures

ELECTROACOUSTIC TRANSDUCER OF THE FLEXURAL VIBRATING DIAPHRAGM TYPE

This invention relates to electroacoustic transducers, and more particularly to electroacoustic transducers of the vibratile diaphragm type which employ a peripherally clamped diaphragm driven in a flexural resonant mode of vibration; such as, for example, are illustrated in the structures shown in FIG. 2 of U.S. Pat. No. 3,128,532 and FIG. 1 of U.S. Pat. No. 3,638,052. The vibratile diaphragm in this type of transducer may be operated at either its fundamental resonant frequency mode or at an overtone resonant mode, such as is exemplified, for example, in FIGS. 7 and 8 of U.S. Pat. No. 3,638,052. Although this invention is not limited to the high frequency region, it is of particular economic value when used at the higher audible frequencies or in the ultrasonic frequency region.

When manufacturing large quantities of this type of transducer, it is difficult to precisely control all of the manufacturing tolerances of the structural elements which affect the resonant frequency of the vibrating system. As a result, increased production costs are incurred when it is desired to achieve a high degree of uniformity among the frequency-response characteristics of the transducers. One method for controlling the uniformity of the frequency-response characteristics among mass-produced transducers of the vibratile diaphragm type is described in U.S. Pat. No. 3,128,532, col. 5, lines 5–13, and consists in setting the mechanical tolerances of the components such that the transducer assembly resonates at a frequency higher than the desired frequency of operation and then sufficient material is removed from the surface of the diaphragm after assembly until the resonant frequency is lowered to the precise desired value.

In the case of transducers utilizing thin diaphragms which are generally less than 1 mm thick, two time-consuming limitations are introduced by the described frequency adjustment procedure. When the diaphragm is very thin and material from the surface of the diaphragm is to be removed, the rate of removal of the material must be carefully controlled to prevent excessive heating of the thin diaphragm which might damage the piezoelectric element which is bonded to the opposite surface of the diaphragm as illustrated in FIG. 2 of U.S. Pat. No. 3,128,532. The necessity for carefully controlling the machining operation over the surface of the diaphragm results in increased production costs. A second limitation is introducd during the machining of the diaphragm surface when adjusting the resonant frequency for prior art thin diaphragm structures because the resonant frequency of a thin diaphragm changes rapidly with small changes in diaphragm thickness and therefore it becomes more difficult to control the critical machining operation which is required during the final removal of the exact tiny amount of material from the diaphragm surface during the precise adjustment of the resonant frequency. This limitation also necessitates added time for the manufacturing operation which, in turn, results in additional increased production cost. The present invention overcomes these limitations by providing a novel diaphragm construction which makes the resonant frequency of the transducer less critically dependent on the amount of material removed from the diaphragm surface.

The primary object of this invention is to improve the design of an electroacoustic transducer employing a vibratile diaphragm whereby the resonant frequency of lrge quantities of manufactured transducers may be economically adjusted to a uniform value.

Another object of this invention is to provide an improved construction of an electroacoustic transducer employing a vibratile diaphragm whereby the operating efficiency is improved.

A still further object of this invention is to provide a simple low-cost structure for an electroacoustic transducer in which the vibratile diaphragm forms a closure for a cylindrical tubular housing and the sound radiating surface of the diaphragm is shaped generally concave to achieve an increased diaphragm thickness at its periphery relative to its central region for permitting the adjustment of the resonant frequency of the transducer in a simpler and more accurately controlled manner over prior art structures.

In keeping with one aspect of this invention, these and other objects are accomplished by providing a vibratile disc driven by a piezoelectric element.

These and other objects, features, and advantages of the invention will become more apparent from a study of the following description when taken in conjunction with the accompanying drawings in which.

Figure 1:
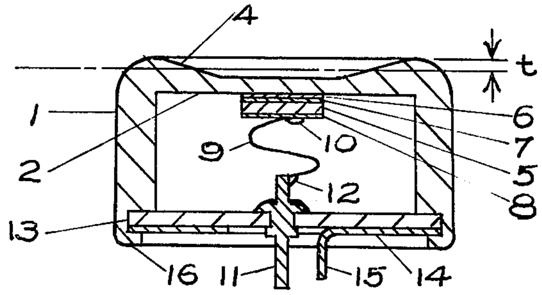
FIG. 1 is a cross-sectional view of a transducer assembly incorporating one embodiment of my invention.

Referring more particularly to the figures, FIG. 1 illustrates one embodiment of this invention. The reference character 1 represents a housing structure which comprises a cylindrical wall portion and a closed end portion having a flat internal surface 2 and a generally tapered concave outer surface 4 as illustrated. The closed end portion behaves as a circular disc clamped at its periphery and serves as a vibratile diaphragm which may be driven at either its fundamental resonant frequency mode of vibration or at an overtone resonant mode of vibration such as described and illustrated in U.S. Pat. No. 3,638,052. The concave outer surface 4 of the vibratile diaphragm portion of the housing structure results in a minimum wall thickness near the center portion of the diaphragm and a gradually increasing wall thickness toward the outer peripheral clamped portion of the diaphragm. The vibratile diaphragm is driven in a conventional manner by a polarized ceramic disc 5 which is attached to the center of the inside surface 2 of the diaphragm with a suitable rigid cement 6, such as epoxy. In this type of construction the epoxy cement 6 is of the electrically conducting type in order that electrical connection may be established between the diaphragm surface 2 and the electrode surface 7 of the ceramic element. The opposite electrode surface 8 of the ceramic is connected to one end of a flexible wire 9 by means of solder 10; the opposite end of the wire 9 is electrically connected to the terminal pin 11 by the solder 12. The terminal pin 11 is attached to the center of an electrical insulating washer 13 as illustrated. A metal washer 14 having a tab portion 15 near its center opening is clamped in position as illustrated by spinning over the edge 16 of the housing. External electrical power for operating the transducer is connected to terminals 11 and 15.

The general construction of the transducer illustrated in FIG. 1 is similar to the construction used in prior art structures of the same type with the exception that in this instance the outer radiating surface of the vibratile diaphragm is concave instead of plane, which is the basic difference between this invention and the prior art structures. The purpose of the concave outer surface of the vibratile diaphragm is to permit a precise adjustment of the resonant frequency of the transducer without the disadvantages inherent in making similar adjustments in prior art structures employing conventional flat diaphragms.

Figure 2:
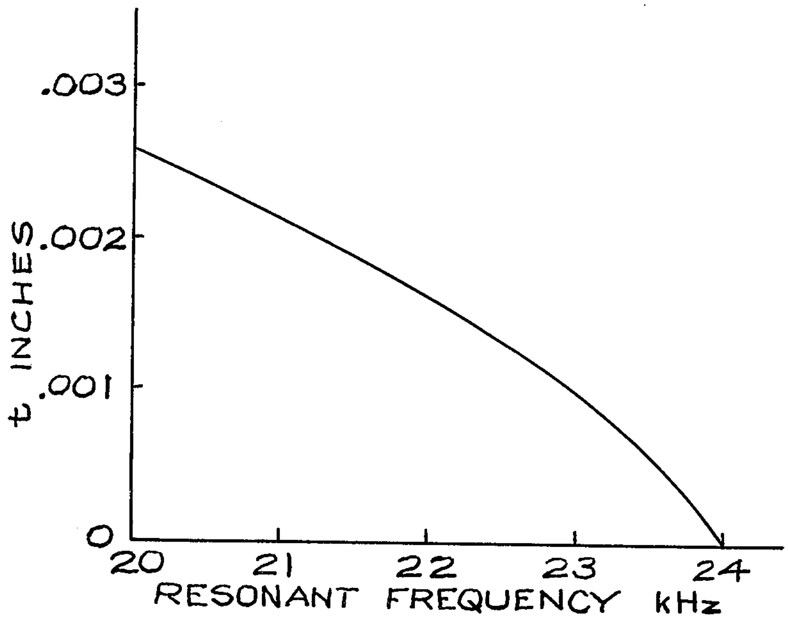
FIG. 2 is a graphical representation of the change in the first overtone resonant frequency mode of vibration of the transducer illustrated in FIG. 1 as a function of the amount of material (t) removed from the outer surface of the vibratile diaphragm structure.

The improved effectiveness in adjusting the resonant frequency of a finished transducer incorporating the teachings of this invention is illustrated by the experimental data plotted in FIG. 2 which shows the change in resonant frequency of the first overtone mode of vibration as a function of the amount of material ($t$) removed from the outer surface of an actual transducer built in accordance with the teachings of this invention and which is desired to operate at 22 kHz. The mechanical tolerances of the structural components are such that the transducers as assembled resonate within a frequency range between approximately 23 kHz and 25 kHz. The specific transducer used to obtain the data shown in FIG. 2 had an initial measured overtone resonance frequency equal to 24 kHz as assembled. The structure is approximately 1 inch diameter and utilizes an aluminum housing which includes a vibratile diaphragm portion which is approximately 0.010 inch thick at its central region and has an external taper, as illustrated in FIG. 1, which increases the diaphragm thickness by approximately 0.004 inch at its outer periphery. FIG. 2 shows the change in the overtone resonant frequency of the assembled transducer as a function of the amount of surface material ($t$) removed. The adjustment of the transducer to the desired lower operating resonant frequency is very simply made by removing the required amount of material from the annualar outer region of the diaphragm surface as illustrated by t in FIG. 1. The rate of change in resonant frequency as a function of the amount of material ($t$) removed is much less rapid for the structure employing the teachings of this invention than would be the case were the removal of material taken over the entire surface of a conventional diaphragm of uniform thickness such as used in prior art transducers.

The one piece housing structure illustrated in FIG. 1 includes a vibratile diaphragm portion which is uniformly and rigidly clamped at its periphery which results in a more uniformly controlled stiffness at the clamped periphery than is possible to achieve with a conventional prior art diaphragm cemented to the open end of tubular housing. The unitary housing and diaphragm construction lends itself to the economical manufacture of mass production quantities of the transducer.

Transducer structures employing aluminum diaphragms ranging in size from approximately ½ inch diameter to 3 inch diameter and designed for operating at resonant frequencies ranging from 15 kHz to 75 kHz have been tested during the development of this invention and experimental data has shown that it is possible to obtain conversion efficiencies from electrical input to acoustic output in excess of 10 percent when the average thickness of the vibratile portion of the diaphragm is less than approximately 7½ percent of the wavelength of sound radiated in air at the operating frequency of the transducer. Using these experimental test data it is possible to establish the relationship between the maximum thickness of an aluminum diaphragm which may be employed in a transducer employing a peripherally clamped vibratile diaphragm as a function of the operating frequency of the transducer in order to achieve efficiencies greater than 10 percent.

During the development of a line of transducers incorporating the teachings of this invention, a correlation of experimental data indicates that in order to realize conversion efficiencies greater than 10 percent for a transducer employing a peripherally clamped aluminum diaphragm when driven by a polarized ceramic disc bonded to the center of one side of the diaphragm the diaphragm thickness must be less than approximately 7½ percent of the wavelength in air at the operating frequency. This relationship may be expressed as, $$t < .075\ \lambda \text{ approximately} \quad (1)$$

where, $t$ = diaphragm thickness in inches $\lambda$ = wavelength of sound in air in inches $$\lambda = \frac{\text{sound velocity}}{\text{frequency}}$$

for air, $$\lambda = \frac{13200}{f(\text{Hz})} = \frac{13.2}{f(\text{kHz})}\text{inch} \quad (2)$$

substituting (2) ) in (1), $$t < .075 \times \frac{13.2}{\text{kHz}}$$

$$t < \frac{1}{\text{kHz}}\text{inch approximately} \quad (3)$$

Thus to achieve an efficiency greater than 10 percent for a transducer employing a peripherally clamped aluminum diaphragm driven by a small piezoelectric ceramic disc attached at the center of one side of the diaphragm, it is required that the diaphragm thickness in inches be made less than the reciprocal of the operating frequency in kHz. If a transducer is designed to operate at 25 kHz, for example, the diaphragm thickness should be made less than 1/25 inch. It may be required in some cases to achieve efficiencies substantially greater than 10 percent in which case the thickness of the aluminum diaphragm must be made substantially less than the maximum limit given by equation (3). If materials of higher density than aluminum are used for the diaphragm the efficiencies will be correspondingly reduced. It is therefore preferable to employ lower density materials such as titanium instead of stainless steel, for example, when aluminum cannot be used in severe environmental applications. To avoid the relatively high reduction in efficiency caused by higher density materials such as steel, copper and brass, it is desirable to limit the choice of materials to be used for vibratile diaphragms to those whose specific gravity is less than 4.

Following is a summary of the advantages of a transducer incorporating the teachings of this invention:

The reduction in resonant frequency of the assembled transducer during its adjustment is relatively much more gradual as a function of the amount of surface material ($t$) which is removed from the tapered diaphragm construction of this invention as compared to the reduction in frequency which results from the removal of material from the flat surface of a conventional prior art diaphragm. For example, in an actual transducer about 1 inch diameter using an aluminum diaphragm of the inventive design with an average thickness of 0.010 inch over most of its vibratile surface, and having a tapered increase in thickness of approximately 0.004 inch at its outer peripheral clamped region, and which resonates at 24 kHz at the first overtone mode of vibration, the removal of .001 inch of material ($t$) causes a resonant frequency reduction of 1 kHz as shown in FIG. 2. If a conventional prior art flat diaphragm 0.010 inch thick were used in the design, the removal of 0.001 inch from the diaphragm surface would cause a frequency change about 2½ times greater thus making it much more difficult to control the precise adjustment of the resonant frequency during production and correspondingly would result in increased production cost.

An additional disadvantage results when attempting to remove material from the flat surface of a conventional prior art diaphragm of uniform thickness such as, for example, by touching the transducer surface against a flat moving abrasive surface. The central portion of the flat diaphragm, being more flexible than the outer edge portion will be held against the abrasive machining surface with less effective pressure thereby introducing a nonuniform cutting rate over the diaphragm surface which introduces an additional variable to be controlled in production.

Another disadvantage associated with the conventional prior art flat diaphragm construction is that heat will be generated over the thin center region of the diaphragm while it is in contact with the abrasive machining surface which in turn may overheat the thin ceramic disc attached to the opposite center surface of diaphragm and cause changes in the operating characteristics of the transducer. If the heat is not sufficient to depolarize the ceramic to render the transducer inoperative, it may easily be sufficient to cause a temporary change in the piezoelectric properties of the ceramic which would result in the adjustment of the resonant frequency of the transducer to an erroneous unstable value which would change during storage and thus could drift outside of specification tolerances when subsequently placed in service.

All of the disadvantages cited above for the flat prior art diaphragm construction are removed by using the tapered diaphragm construction disclosed in this invention. The adjustment of the resonant frequency of the assembled inventive transducer is simply achieved by the removal of material only from the rigid rim portion of the concave diaphragm surface as illustrated by ($t$) in FIG. 1. The machining operation is thus more positive and the admustment to the desired resonance frequency is less critically dependent on the amount of material removed. Since the concave shape does not require any contact with the central portion of the vibratile diaphragm during machining the risk of overheating the ceramic is materially reduced.

Although the preferred embodiment has been described as a one piece housing structure as illustrated in FIG. 1, it will be obvious to one skilled in the art that the benefits of this invention can also be achieved if the tapered diaphragm portion of the structure is constructed as a separate disc and then bonded to an open end of a tubular housing portion.

Although this invention has been illustrated with a transducer designed for operating in air it will be obvious to one skilled in the art that the teachings of this invention, including the use of the concave diaphragm construction, could be advantageously applied to underwatr transducers in which case the diaphragm thickness would generally be greater than the diaphragm thickness required for air and the values derived in equation (3) would obviously not apply to underwater transducers because of the difference in magnitude of the radiation impedance of water as compared to air. Some specific types of underwater transducers in which the teachings of this invention could be applied are illustrated in FIGS. 4 and 5 of U.S. Pat. No. 3,510,698.

Several specific embodiments of this invention have been illustrated and described and it will be obvious to one skilled in the art that additional modifications may be made without departing from the true spirit and scope of the invention; therefore, the appended claims are intended to cover all equivalents that will fall within the true spirit and scope of this invention.

I claim:

1. In combination in an electroacoustic transducer, a tubular housing structure, a vibratile diaphragm peripherally clamped to said housing structure, said diaphragm characterized in that it operates in a flexural resonant mode of vibration at a prescribed resonant frequency, said vibratile diaphragm further characterized in that its external radiating surface is concave whereby the thickness of said diaphragm increases from the center portion of said vibratile diaphragm to the outer peripheral rim portionn of said vibratile diaphragm, said vibratile diaphragm still further characterized in that the increased flexural stiffness of said diaphragm resulting from the increased thickness of said diaphragm near its peripheral region has a substantial influence in the determination of the flexural resonant frequency of said electroacoustic transducer, said diaphragm still further characterized in that the increased flexural stiffness resulting from said increase in thickness of said diaphragm near its peripheral region is sufficient to cause an increase in the flexural resonant frequency of said electroacoustic transducer above the prescribed resonant frequency of operation of said transducer, electromechanical transducer means for converting alternating electrical signals to alternating mechanical forces, said electromechanical transducer means adapted for driving said flexural vibratile diaphragm means, and electrical terminal means connected to said electromechanical transducer means.

2. The method for reducing the resonant frequency of the transducer described in claim 1 which includes the step of removing material from the surface of the peripheral portion of said concave external radiating surface of said vibratile diaphragm.

3. The invention in claim 1 further characterized in that the thickness of said vibratile diaphragm at its minimum thickness region is less than $1/f$ inch, where f is the operating frequency of the transducer in kHz.

4. The invention in claim 1 further characterized in that said diaphragm has a specific gravity less than 4.

5. In combination in an electroacoustic transducer, a one piece housing structure including a tubular wall portion and a vibratile diaphragm portion which serves as a closure for one end of said tubular wall portion, said vibratile diaphragm portion having a flat internal surface and a concave external surface whereby the thickness of said vibratile diaphragm portion is a minimum near the central region of said vibratile diaphragm portion and the thickness increases toward the outer peripheral region of said vibratile diaphragm portion, said diaphragm characterized in that it operates in a flexural resonant mode of vibration at a prescribed resonant frequency, said diaphragm further characterized in that the increased flexural stiffness resulting from the increased thickness of said diaphragm near its peripheral region has a substantial influence in the determination of the resonant frequency of said electroacoustic transducer, said diaphragm still further characterized in that the increased flexural stiffness resulting from said increase in thickness of said diaphragm near its peripheral region is sufficient to cause an increase in resonant frequency of said electroacoustic transducer above the prescribed resonant frequency of operation of said transducer, electromechanical transducer means for converting alternating electrical signals to alternating mechanical forces, said electromechanical transducer means adapted for driving said flexural vibratile diaphragm means, and electrical terminal means connected to said electromechanical transducer means.

6. The method for reducing the resonant frequency of the transducer described in claim 5 which includes the step of removing material from the surface of the peripheral portion of said concave external radiating surface of said vibratile diaphragm.

7. The invention in claim 5 further characterized in that the minimum thickness of said vibratile diaphragm is less than $1/f$ inch, where f is the operating frequency of said electroacoustic transducer in kHz.

8. The invention in claim 4 further characterized in that said one piece housing structure comprises a material having a specific gravity less than 4.

9. The invention in claim 8 further characterized in that said material is aluminum.

* * * * *

UNITED STATES PATENT OFFICE
CERTIFICATE OF CORRECTION

Patent No. 3,943,388 Dated March 9, 1976

Inventor(s) Frank Massa

It is certified that error appears in the above-identified patent and that said Letters Patent are hereby corrected as shown below:

On the cover sheet item (73) has been changed to read:

-- Fred M. Dellorfano, Jr. and Donald P. Massa,

Trestees of the Stoneleigh Trust u/d/t December 4, 1973, both of Cohasset, Mass.

Signed and Sealed this

*fifteenth* Day of *June 1976*

[SEAL]

*Attest:*

RUTH C. MASON
*Attesting Officer*

C. MARSHALL DANN
*Commissioner of Patents and Trademarks*